United States Patent [19]

Seo et al.

[11] Patent Number: 5,550,776
[45] Date of Patent: Aug. 27, 1996

[54] SEMICONDUCTOR MEMORY DEVICE CAPABLE OF DRIVING WORD LINES AT HIGH SPEED

[75] Inventors: Dong-il Seo, Kyungki-do; Tae-Seong Jang, Boosan, both of Rep. of Korea

[73] Assignee: Samsung Electronics Co., Ltd., Suwon, Rep. of Korea

[21] Appl. No.: 280,849

[22] Filed: Jul. 26, 1994

Related U.S. Application Data

[63] Continuation-in-part of Ser. No. 224,480, Apr. 6, 1994, abandoned.

[51] Int. Cl.⁶ .............................. G11C 7/00; G11C 17/16
[52] U.S. Cl. ............... 365/200; 365/230.06; 365/230.08
[58] Field of Search .................. 365/230.01, 230.06, 365/189.01, 230.08

[56] References Cited

U.S. PATENT DOCUMENTS

| | | | |
|---|---|---|---|
| 5,168,468 | 12/1992 | Magome et al. | 365/200 |
| 5,276,360 | 1/1994 | Fujima | 365/230.06 |
| 5,311,472 | 5/1994 | Ota | 365/200 |
| 5,327,381 | 7/1994 | Johnson et al. | 365/200 |

*Primary Examiner*—Viet Q. Nguyen
*Attorney, Agent, or Firm*—Cushman Darby & Cushman, L.L.P.

[57] ABSTRACT

A semiconductor memory device for driving word lines at high speed has a word line signal generating circuit for receiving a predecoded signal of a row address, and power source supply circuit for supplying the output signal of the word line signal generating circuit to a word line as source power. The device includes a normal word line decoder for receiving the predecoded signal and the output signal of the power source supplying circuit, respectively and for selecting a normal word line; a spare word line decoder for receiving the predecoded signal and the output signal of the power source supply circuit, respectively and for selecting a spare word line; and a redundancy enabling circuit connected to the spare word line decoder and the normal word line decoder for determining whether the normal word line is selected.

5 Claims, 6 Drawing Sheets

SEMICONDUCTOR MEMORY DEVICE CAPABLE OF DRIVING WORD LINES AT HIGH SPEED

This is a continuation-in-part application of U.S. application Ser. No. 08/224,480 filed Apr. 6, 1994, now abandoned.

This application has priority rights based on Korean Application No. 5723/1993 filed Apr. 6, 1993, which Korean Application is hereby incorporated by reference.

FIELD OF THE INVENTION

It is generally known that a system having a semiconductor memory device as a memory element operates at high speed by utilizing a frequency divider. However, semiconductor memory devices are limited in their ability to increase data access speed due to increases in RC loading (where R and C represent specific resistance and capacitance, respectively) of the semiconductor memory device under a sub-micron design rule. The "data access speed" stated above refers to the speed at which data is read and written from/to a memory cell. The data access speed depends largely upon the driving speed of a word line connected to a gate transistor of the memory cell.

FIG. 1 is a block diagram showing elements used in a conventional method of driving a word line. In the configuration shown, if a row address strobe (RAS) supplied externally from the chip changes to an active "low" level, the chip is advanced to an active cycle. Then a row address input buffer 50A (or "RAI") is enabled and, upon receipt of address information, a decoded address signal output from the row address input buffer 50A is input to a predecoder 50B. Thereafter, the output signal of the predecoder 50B is input to each of a first control signal φXE generation circuit 50C, a normal word line decoder 50F, and a spare word line decoder 50H as address information. Furthermore, a signal output from the φXE generation circuit 50C is received by a second control signal φXEX generation circuit 50D, a row redundancy enable signal φRRE generation circuit 50G, and the spare word line decoder 50H. A signal output from the φXEX generation circuit is then received by a third control signal φX generation circuit 50E, and the signal output from the φX generation circuit 50E then functions as a power source for the normal word line decoder 50F and the spare word line decoder 50H.

FIG. 2 is an operation timing chart of FIG. 1.

The spare word line decoder 50H, the φRRE generation circuit 50G and the normal word line decoder 50F may be constructed as shown in FIG. 3A, FIG. 3B and FIG. 3C, respectively.

The signal output from the row address input buffer 50A is generated as a function of the signal received from the row address strobe $\overline{RAS}$, the output of the φXE generation circuit 50C is synchronously generated as a function of the signal received from the output of the RAI buffer 50A, the output of the φXEX generation circuit 50D is generated as a function of the signal received from the φXE generation circuit 50C, and the output of the φX generation circuit 50E is generated as a function of the signal received from the φXEX generation circuit 50C, respectively.

Referring to FIG. 3A illustrating the spare word line decoder 50H of FIG. 1 during a precharge cycle, a node A and a node B are precharged to a logic "high" state in response to a row decoder precharge signal φDPX of a logic "low" state. Then, if normal word line address information is input, the node A changes to a logic "low" state. In the case where node A has the logic "low" state, and transistors 1 and 2 are turned off, a driver stage indicated by a dotted line maintains a disable state. In the meanwhile, however, if address information for accessing a defective normal word line is input, node A (or "RED" which represents a "redundancy enable driving" node) stays at the logic "high" state. After awhile, if the signal φXE changes to the logic "high" state, transistors 3 and 4 are both turned on. As a result, the node B goes to the "low state". Accordingly, a self-boosting node is precharged to a voltage Vcc-Vt (where Vt represents a threshold voltage of a transistor 6), and the signal φX is output to an output terminal OUT.

In the φRRE generation circuit 50G of FIG. 3B, if a redundancy enabling driving signal RED goes to the "low" state before the signal φXE changes to the "high" state, a normal word line selection transistor 12 is turned off. Then, the signal φRRE remains in the "low" state through an inverter 15. Meanwhile, if the signal RED maintains the "high" state until the signal φXE changes to the "high" state (at this time, the spare word line is selected), transistors 12 and 13 are turned on and the signal φRRE goes to the "high" state, thereby disabling the normal word line decoder 50F.

In the case of the normal word line decoder 50F of FIG. 3C, since the signal φRRE is applied to the gate of a transistor 21, if the signal φRRE becomes "low" the transistor 21 is turned off, and node C maintains at a precharge state. Next, if the signal φX is input, the level of that signal is output through a transistor 24. Meanwhile, if the signal φRRE becomes "high", node C goes "low", and the transistor 24 is turned off. In this instance, the input signal φX is not output to the output terminal OUT.

The reason that signal φXEX generation circuit 50D in FIG. 1 is required in the conventional method for driving a word line will now be explained with more particularity. Where the spare word line of a redundancy cell array is selected due to a defect in a normal memory cell, the input address for changing the logic state at node A as a precharge node of the spare word line in FIG. 3A is cut off upon receipt of the address signal of the defective memory. Here, if signal φXE is input, the node B changes to an enabling state, that is, to the "low" state by the conductive state of the transistors 1 and 2. If the node B becomes "low", the self-boosting node is precharged to a voltage Vcc-Vt. At this time, signal φXEX is required to input signal φX. If such an operation is not performed orderly as expected, a defect of the word line will occur due to the rapid decrease in the boosting rate, or the signal φXE level is not changed enough via a transistor 7. As a result, since the signal φXE cannot directly enable signal φX, it is necessary for the signal φXE to travel through the path from the signal φXE to the signal φXEX and then φX (namely, the precharge time of the self boosting is ensured).

The conventional method for driving a word line is, however, faced with the following problems. First, signal φXE is limited in its enabling time. That is, if signal φXE in FIG. 3A is input while the RED signal changes to the "low" state, transistors 3 and 4 are turned on and node B is in the "low" state. Then, when the signal φX is input, the output of the signal φX may erroneously be enabled. Thus, the signal φXE must be input after the transistor 3 is turned off by the RED signal. Further, in FIG. 3B, if the signal φXE is enabled in the course of changing the RED signal to the "low" state, a glitch phenomenon of signal φRRE may occur, and node C may thus change to the "low" level so that the selection of a normal word line is not made. Second, there is a problem in that the normal word line and the spare word line are selected at the same time. That is, in FIGS. 3B and 3C, when the glitch in signal φRRE makes it so that signal φRRE is incapable of turning on transistor 21, due to the narrow generating interval of the signals RED and φXE (in other words when the glitch level of the signal φRRE is smaller than that of Vt), the normal word line is enabled, and in this state, the RED signal overlaps with signal φXE. When the signal φXE is input, the signal φX level is output via the transistor 7. As a result, the undesirable phenomenon that the normal word line and the spare word line are enabled at the same time occurs.

SUMMARY OF THE INVENTION

It is therefore one object of the present invention to provide a semiconductor memory device capable of driving a word line at high speed.

It is another object of the present invention to provide a semiconductor memory device that prevents a normal word line and a spare word line from being enabled at the same time.

It is a further object of the present invention to provide a semiconductor memory device capable of easily adjusting the enabling time of a signal φX supplied to a word line power source.

It is another object of the present invention to provide a semiconductor memory device capable of preventing an undesired selection of a word line due to a glitch in a redundancy enabling signal.

It is a further object of the present invention to provide a semiconductor memory device capable of easily adjusting the enabling time of a signal φX supplied to a word line and, at the same time, of driving a word line at high speed.

To achieve these objects, the present invention is directed to a semiconductor memory device in which each normal word line and spare word line is driven only by a decoded signal of a row address.

According to the present invention, a semiconductor memory device includes a row address input buffer which is synchronous to an input of a row address strobe signal and initiates a sequence of operations which use interconnected circuits of the memory device. These include a predecoder that inputs the output signal from the row address input buffer and predecodes a row address therefrom. A word line signal generation circuit generates a word line signal from the output signal of the predecoder. A power supply source inputs the output signal of the word line signal generation circuit and supplies source power to a given word line. A normal word line decoder inputs respective output signals of the predecoder and the power supply source and selects a normal word line. A spare word line decoder inputs respective output signals of the predecoder and the power supply source and selects a spare word line when a row address corresponding to the spare row decoder address is detected.

The semiconductor memory device according to the preferred embodiment of the present invention advantageously omits a circuit for delaying the application time of a word line boosting signal. Specifically, a conventional φXEX generation circuit for generating a signal φX from an input of a row address after a predetermined delay time is made unnecessary. In addition, the φRRE generation circuit is driven only from the redundancy signal obtained from the spare word line decoder.

BRIEF DESCRIPTION OF THE DRAWINGS

These and other objects, features, and advantages of the present invention will be better understood in view of the following detailed description of the invention, taken in conjunction with the accompanying drawings. In the drawings, it should be noted that like elements are represented by like symbols or reference numerals, wherein.

DETAILED DESCRIPTION OF THE PREFERRED EMBODIMENTS

The term "word line signal generation circuit" used herein refers to a circuit for generating a word line boosting signal from a row address, the word line boosting signal being input to a typical word line power source for supplying source power to a word line.

Figure 1:
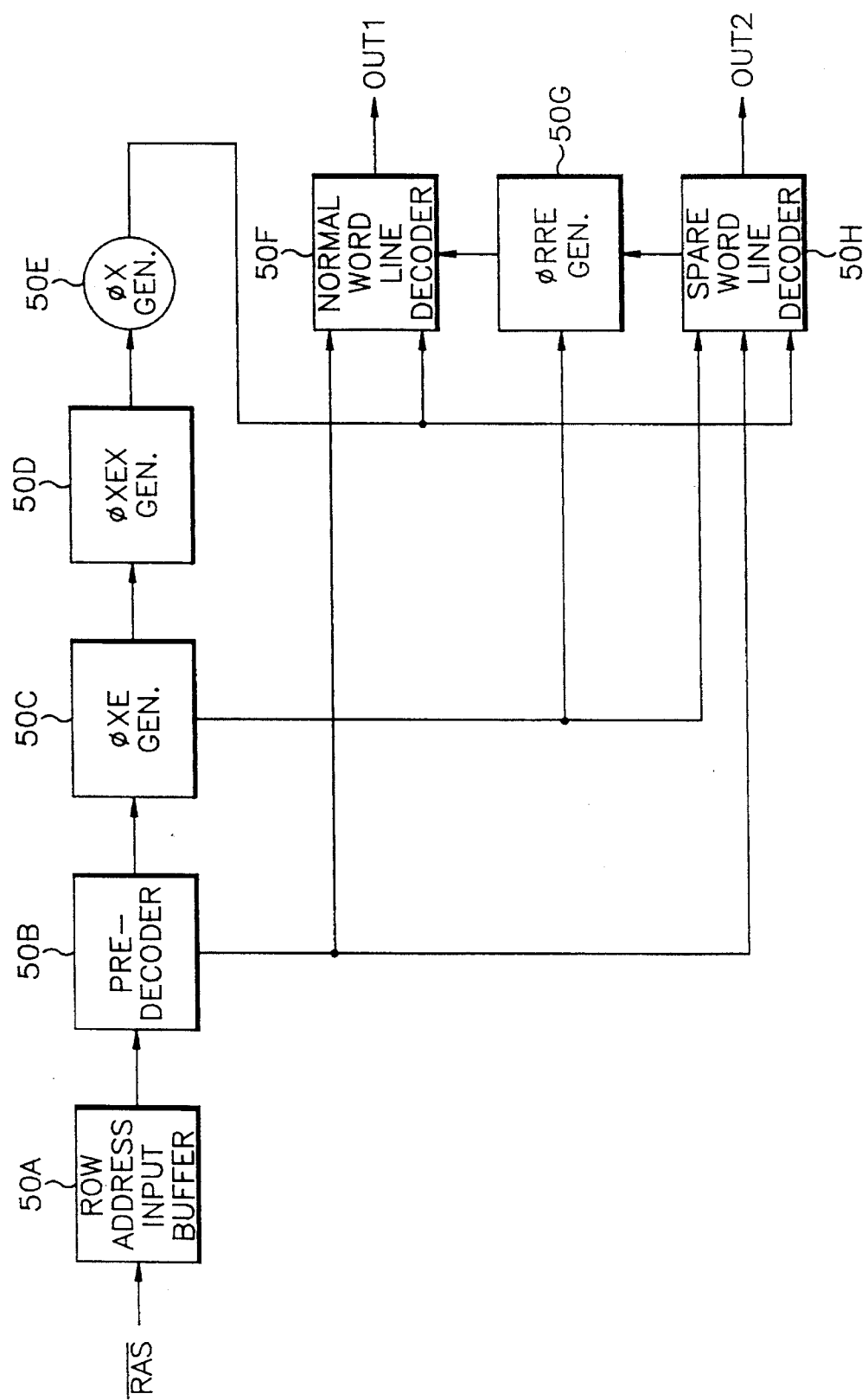
FIG. 1 is a block diagram showing elements used in a conventional method for driving a word line.
Figure 2:
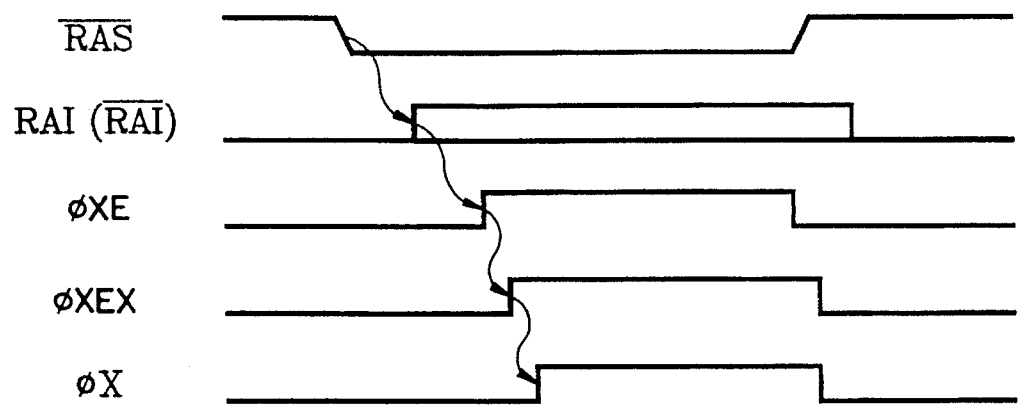
FIG. 2 is a timing chart for the word line driving method of FIG. 1.
Figure 3A:
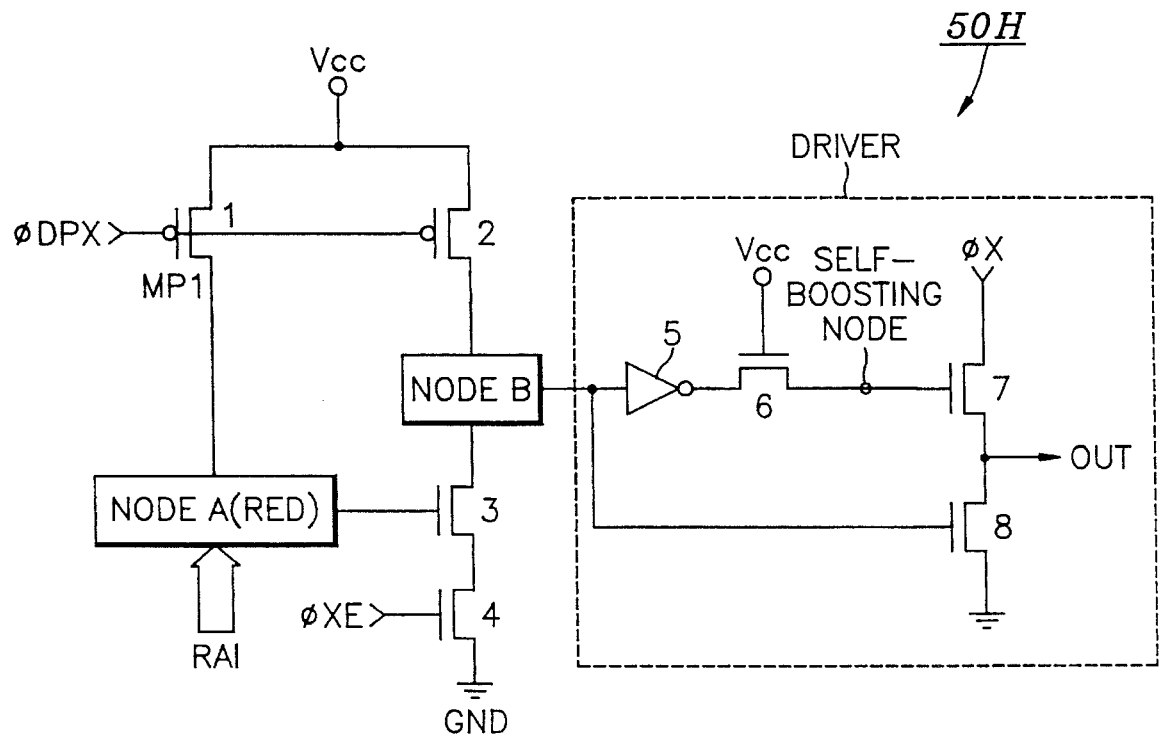
FIG. 3A is a detailed circuit diagram showing the spare word line decoder of FIG. 1.
Figure 3B:
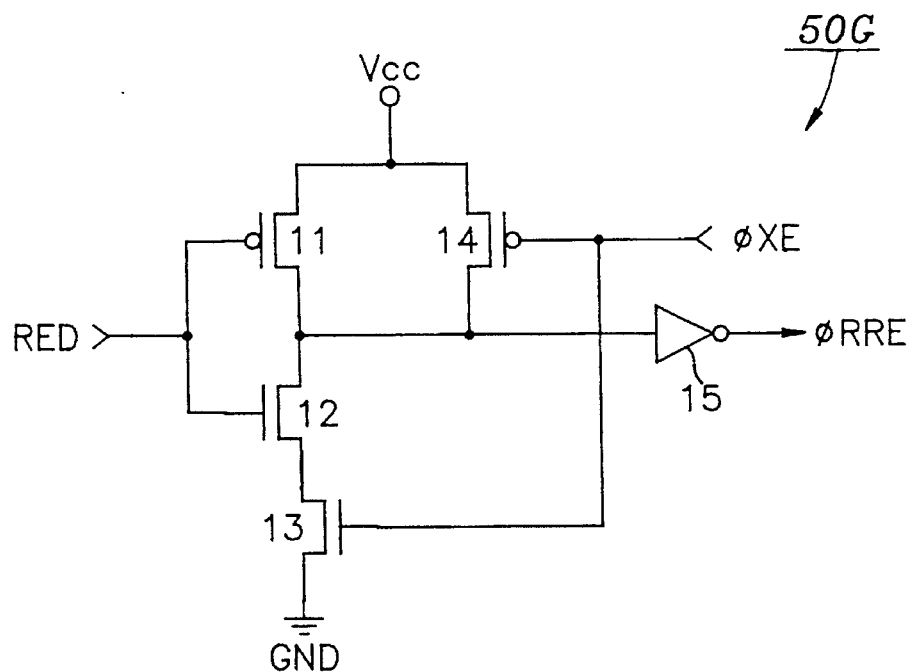
FIG. 3B is a detailed diagram showing the redundancy enabling circuit of FIG. 1.
Figure 3C:
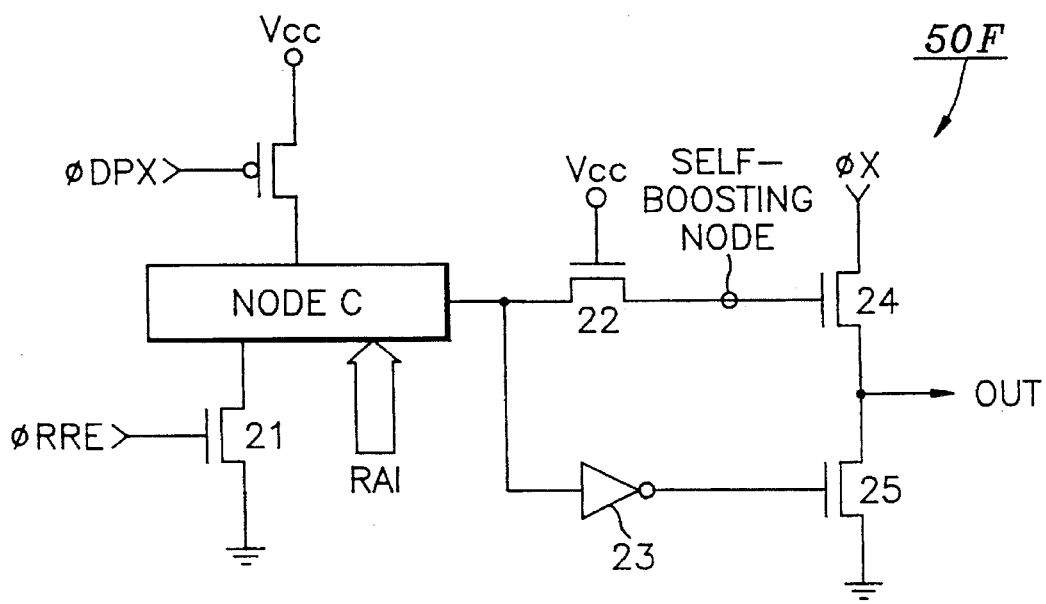
FIG. 3C is a detailed circuit diagram showing the normal word line decoder of FIG. 1.

In order to supply sufficient driving power to the word lines in the prior art circuit of FIG. 3A, it is generally required that signal φX be supplied to the transistor 7 during or after the self-boosting node changes fully to the "high" level. However, the transistor 4 is controlled by the signal φXE, and thus, the logic level at the self-boosting node is determined with a specific time delay (through the elements 3, 4, 5 and 6). Therefore, signal φX must be sufficiently delayed. To accomplish this result, the signal φXE is delayed twice by 50D and 50E of FIG. 1 to obtain resultant signal φX in the order of φXE-φXEX-φX as shown in FIG. 2. If this sequence of obtaining the resultant signal φX is not ensured, the spare word line connected to the output voltage may not be driven properly due to insufficient driving power. The present invention eliminates the step of using the φXEX generation circuit to delay signal φXE in obtaining the sufficiently delayed signal φX.

Figure 4:
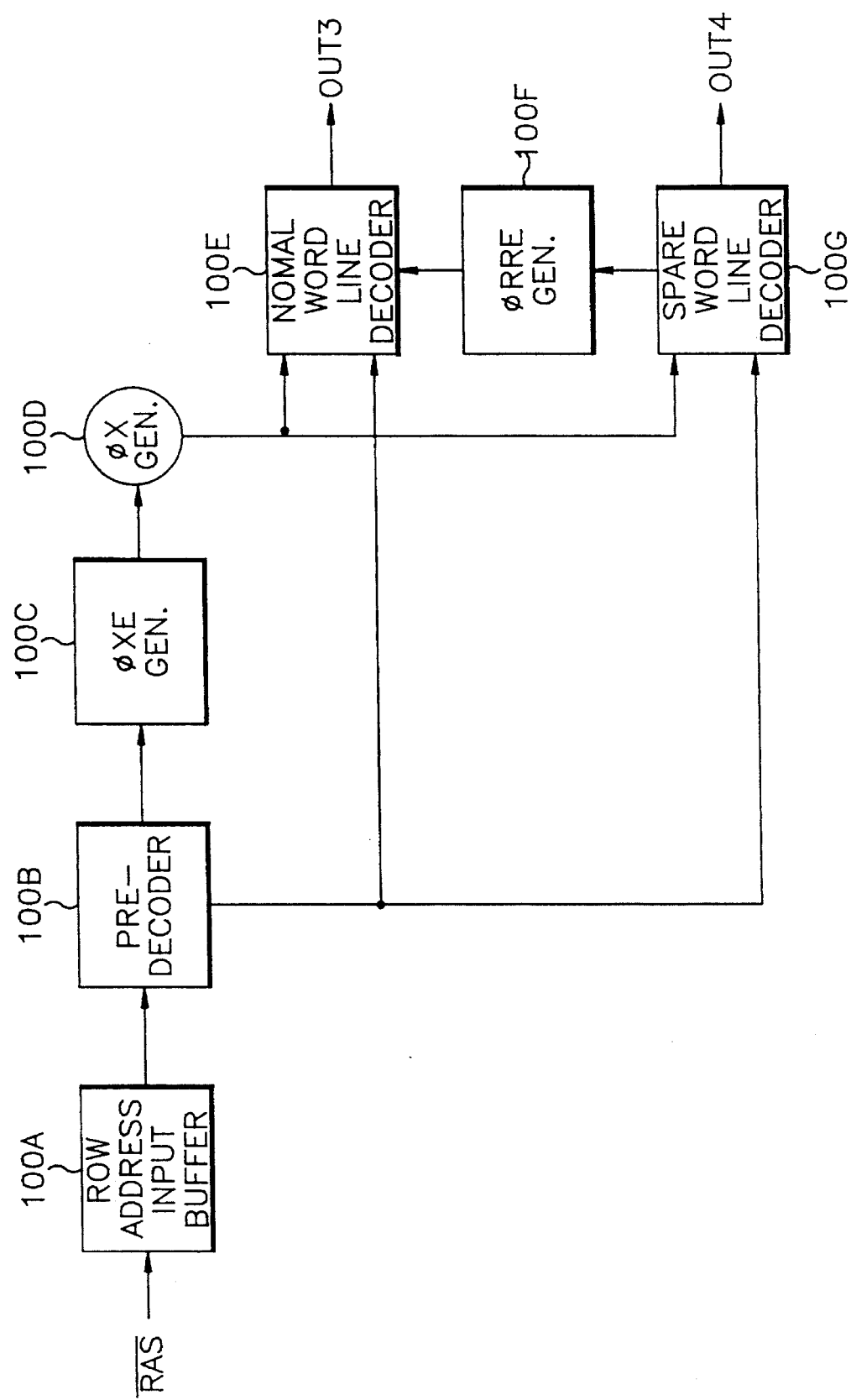
FIG. 4 is a schematic block diagram showing the elements used in a method for driving a word line according to an embodiment of the present invention.

Referring to FIG. 4, there is shown a block diagram illustrating a method for driving a word line according to the present invention. In the configuration shown, if row address strobe signal "RAS" supplied externally from a chip changes to an active signal level, the chip is advanced to an active cycle. At the same time, if address information is input, a row address input buffer RAI 100A is enabled and the decoded address signal of the row address input buffer "RAI" 100A is input to a predecoder 100B. Then, the output signal of the predecoder 100B is input to the address information of a φXE generation circuit 100C, a normal word line decoder 100E and a spare word line decoder 100G, respectively. Further, the output signal of the φXE generation circuit 100C is received by a φX generation circuit 100D. Here, the output signal of the φX generation circuit 100D is supplied as source power to the normal word line decoder 100E and the spare word line decoder 100G, respectively. As disclosed above, the method of the present invention enables data access speed to be greatly increased since the normal word line decoder 100E and the spare word line decoder 100G are operated independent of the φXE generation circuit 100 C, and since the signal φXEX is removed so that the enabling time of the signal φX can be reduced.

Figure 5:
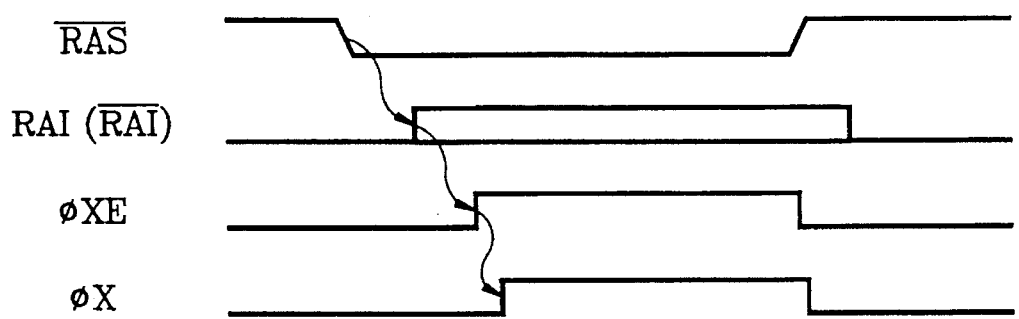
FIG. 5 is a timing chart for the word line driving method of FIG. 4.

FIG. 5 is an operation timing chart of FIG. 4. As shown, the signal φX provided by the φX generation circuit 100D and utilized as source power for the word line signal is enabled after the signal φXE.

Figure 6A:
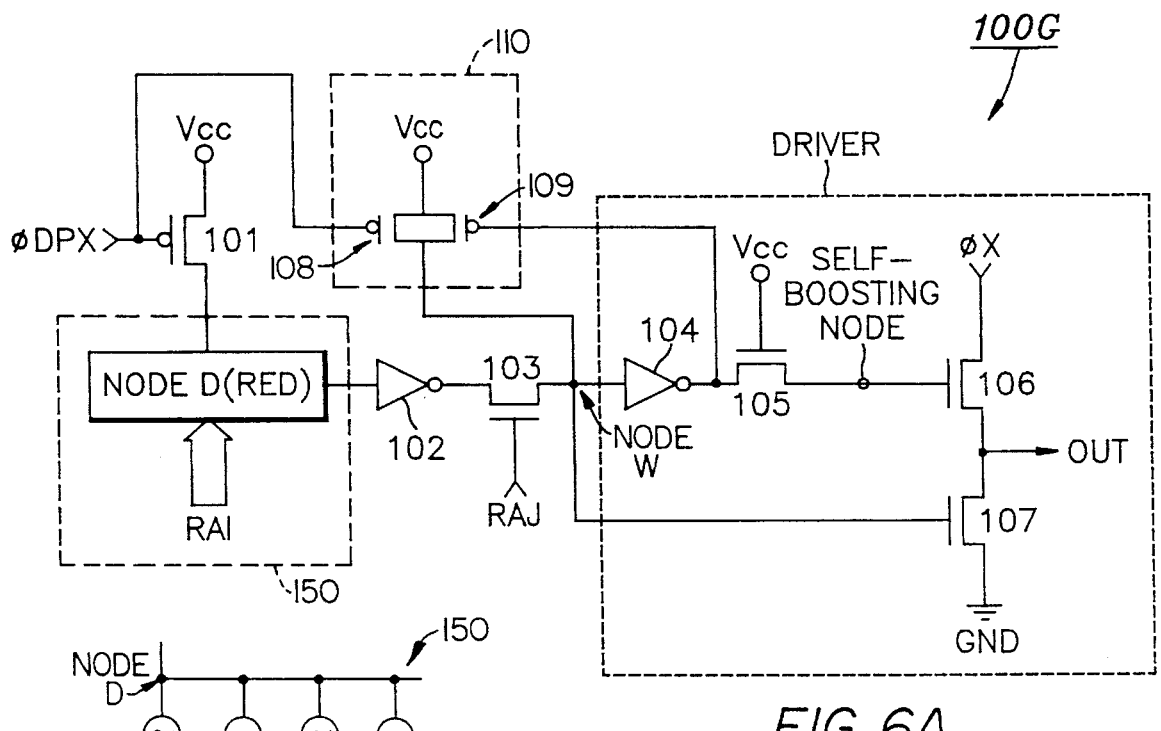
FIG. 6A is a detailed circuit diagram showing the spare word line decoder of FIG. 4.

Referring to FIG. 6A, illustrating the spare word line decoder 100G of FIG. 4, during a precharging cycle, a row decoder precharge signal φDPX disables node D and a driver. If the normal word line is selected, node D changes to the "low" state by operation of the row address input buffer RAI, and the output of an inverter 102 is "high". During this time, although one of the outputs of the spare word line decoder is selected by a row address RAI, the driver maintains a disabling state through operation of the inverter 102. In the case the spare word line of a redundancy array is selected, the node D maintains the "high" state by cutting off the input signal varying the state of the node D (RED). Therefore, the output of the inverter 102 goes "low", and if a transistor 103 is turned on by the row address RAI, the output of an inverter 104 becomes "high", so that a self-boosting node is precharged to a Vcc-Vt. Here, if signal φX is input, the output of the inverter 104 catches up with the signal level φXE so that the spare word line is enabled.

A precharge and holding circuit 110 as shown in FIG. 6A includes two PMOS transistors 108 and 109 connected in parallel between the power supply voltage Vcc and a node W. The transistor 108 receives the signal φDPX of the logic "low" state during a precharge cycle to precharge the voltage at node W to the voltage Vcc. The logic "high" state of the Vcc at node W is inverted by the inverter 104 and turns on the transistor 109, to thereby hold the voltage at node W at the logic "high" state. Thus, transistor 106 is turned off and transistor 107 is turned on, generating a logic "low" state at the output terminal thereof.

Figure 6D:
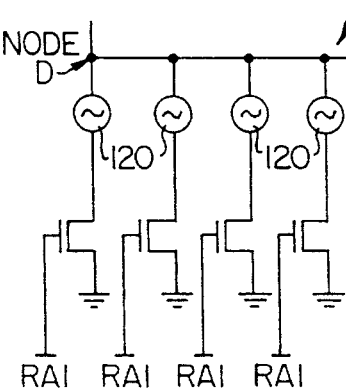
FIG. 6D is a detailed circuit diagram showing NODE D and the input row address RAI of FIG. 6A.

FIG. 6D is a detailed circuit diagram showing NODE D and the input row address "RAI" of FIG. 6A. As shown, this portion of the circuit comprises a plurality of transistors in parallel with one another between RAI and NODE D. The redundant enable driving signal (or "RED" signal) is generated by a fuse box 150 programmed to generate a predetermined logic state upon receipt of programmed address inputs. This programming is done by selectively cutting off predetermined fuses 120.

Figure 6B:
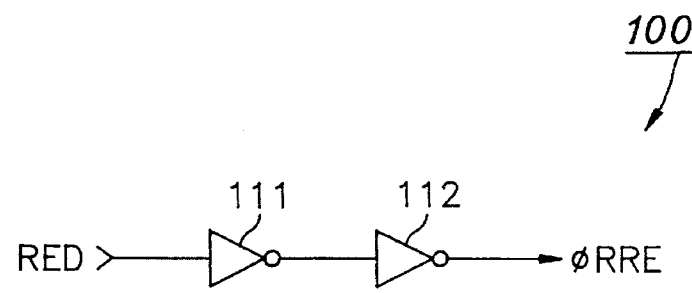
FIG. 6B is a detailed diagram showing the redundancy enabling circuit of FIG. 4.

The φRRE generation circuit 100F is shown in FIG. 6B and functions as the redundancy enabling circuit of FIG. 4. The circuit 100F is constructed to enable only the signal φRRE from the input of the RED signal. That is, if the RED signal is input, only signal φRRE will be enabled by inverters 111 and 112. In the construction of FIG. 6B, the φRRE generation circuit is not necessary for the input of the signal associated with a word line boosting, so that the signal φRRE is capable of being enabled at high speed. In the instance in which the number of the RED information is more than two, the same operation and effect as the above are achieved by using a NOR gate as the inverter 111.

Figure 6C:
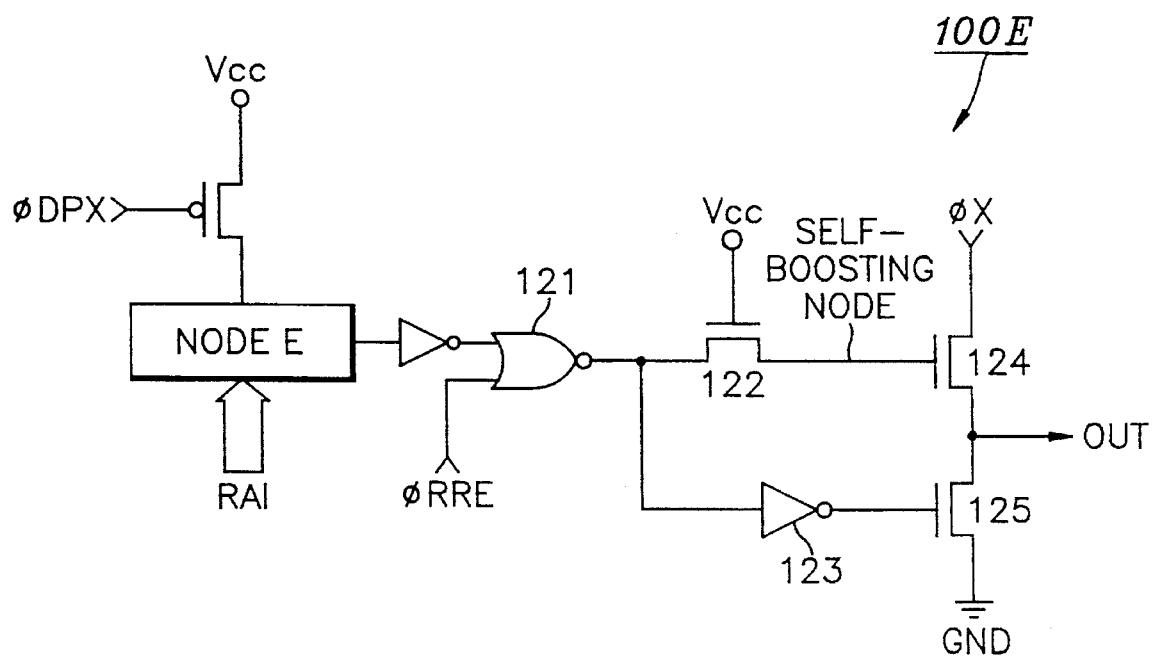
FIG. 6C is a detailed circuit diagram showing the normal word line decoder of FIG. 4.

Referring to FIG. 6C illustrating the normal word line decoder 100E of FIG. 4, when node E is selected, node E maintains the "high" state. Here, non-selected nodes go to the "low" state to disable the driver. If an arbitrary word line is selected in normal cell array blocks of a predetermined selected normal word line decoder, the signal φRRE changes to the "low" state, so that the self-boosting node is precharged as much as Vcc-Vt and the output of the normal word line decoder 100E is enabled according to the input of the signal φX.

As disclosed in the above embodiments of the present invention, the method for driving a word line according to the preferred embodiments of FIG. 4 is employed by directly supplying a word line boosting signal to the normal word line decoder or the spare word line decoder without a circuit (i.e., a φXEX generation circuit) that delays the word line boosting signal, so that the selection of a word line is achieved at a higher speed. In addition, the construction of the circuit for selecting the word line is simple.

The inventive φRRE generation circuit 100F is driven independently of the signal φXE as shown in FIGS. 4 and 6B. This is in contrast to the conventional φRRE generation circuit 50G in FIG. 1, which operates in response to the signal φXE. Since, the normal word line decoder 100E and spare word line decoder 100G of the present invention are operated independently of the signal φXE output from 100C, high data access speed of the device is achieved, and it is not necessary to delay the signal φXE. The φRRE generation circuit 100F of FIG. 6B does not receive the signal φXE. In instance in which the number of data bits of the signal φRED is more than two, the inverter 111 should be replaced with a NOR gate for receiving the multiple input bits of the signal φRED.

FIG. 4 is a functional block diagram employed in view of the spirit of the present invention, and FIGS. 6A, 6B and 6C are the best preferred embodiments on the basis of the block diagram of FIG. 4. In consideration of their logic constructions, however, it is possible for a variety of other embodiments to be employed.

As may be apparent from the aforementioned description, a semiconductor memory device having a data access operation adequately corresponding to the processing speed of a system can be provided by executing the semiconductor memory device for driving a word line at high speed. Further, there are advantages in that the construction of the circuit is quite simple, and in that the conventional inconvenience that the application time of a word line boosting signal must be timely set is also removed.

While there is shown and described the preferred embodiment of the invention, it will be understood by those skilled in the art that foregoing and other changes in form and details may be made without departing from the spirit and scope of the present invention.

What is claimed is:

1. A semiconductor memory device comprising:

a row address input buffer which receives a row address strobe signal and generates a row address signal;

a predecoder which receives said row address signal and predecodes said row address signal to form a predecoder output signal;

a word line signal generator which receives said predecoder output signal and generates a word line signal;

a power source supply circuit which receives said word line signal and generates a source power signal therefrom;

a spare word line decoder which receives said predecoder output signal and said source power signal and generates a redundancy enable driving signal when said spare word line decoder decodes a spare word line address;

a redundancy enabling circuit which receives and amplifies said redundancy enable driving signal to generate therefrom a row redundancy signal, said row redundancy circuit using neither said source power signal, nor any signal derived from said source power signal, to generate said row redundancy signal; and a normal word line decoder which receives said predecoder output signal, said source power signal and said row redundancy signal, said normal word line decoder being operable to select a normal word line in the absence of said row redundancy enabling signal.

2. A semiconductor memory device according to claim 1 wherein said redundancy enabling circuit comprises an inverter chain.

3. A semiconductor memory device according to claim 2 wherein said inverter chain consists of two inverters.

4. A semiconductor memory device according to claim 2 wherein said inverter chain comprises two inverters.

5. A semiconductor memory device according to claim 1 wherein said normal word line decoder determines decodes said row address and subsequently determines, using said row redundancy signal, whether to select said normal word line.

* * * * *